(12) United States Patent
Ueda

(10) Patent No.: US 11,929,240 B2
(45) Date of Patent: Mar. 12, 2024

(54) SUBSTRATE SUPPORT, SUBSTRATE PROCESSING APPARATUS, AND SUBSTRATE PROCESSING METHOD

(71) Applicant: Tokyo Electron Limited, Tokyo (JP)

(72) Inventor: Takehiro Ueda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 258 days.

(21) Appl. No.: 17/494,846

(22) Filed: Oct. 6, 2021

(65) Prior Publication Data

US 2022/0108879 A1  Apr. 7, 2022

(30) Foreign Application Priority Data

Oct. 6, 2020 (JP) ................. 2020-169175

(51) Int. Cl.
*H01J 37/32* (2006.01)
*H01L 21/687* (2006.01)

(52) U.S. Cl.
CPC .. *H01J 37/32724* (2013.01); *H01J 37/32642* (2013.01); *H01L 21/68735* (2013.01); *H01J 2237/334* (2013.01)

(58) Field of Classification Search
CPC .......... H01J 37/32724; H01J 37/32642; H01L 21/68735

See application file for complete search history.

(56) References Cited

U.S. PATENT DOCUMENTS

2021/0134554 A1*  5/2021  Noorbakhsh ....... H01L 21/6833

FOREIGN PATENT DOCUMENTS

JP    2011-124377 A    6/2011

* cited by examiner

*Primary Examiner* — Walter H Swanson
(74) *Attorney, Agent, or Firm* — XSENSUS LLP

(57) ABSTRACT

A technique allows control of the etching rate at an outer periphery of a substrate being processed. A substrate support includes a substrate support portion that supports a substrate, and an edge ring support that supports an edge ring surrounding the substrate supported on the substrate support portion. The edge ring support includes a plurality of heating elements arranged in a circumferential direction of the edge ring support and a plurality of heater power feeders. Each of the plurality of heater power feeders is included in a corresponding heating element of the plurality of heating elements to provide power from an external source to the corresponding heating element.

7 Claims, 15 Drawing Sheets

SUBSTRATE SUPPORT, SUBSTRATE PROCESSING APPARATUS, AND SUBSTRATE PROCESSING METHOD

CROSS-REFERENCE TO RELATED APPLICATION

This application claims priority to Japanese Patent Application No. 2020-169175 filed on Oct. 6, 2020, the entire disclosure of which is incorporated herein by reference.

BACKGROUND

Technical Field

The present disclosure relates to a substrate support, a substrate processing apparatus, and a substrate processing method.

Description of the Background

For example, Patent Literature 1 describes a plasma etching apparatus that adjusts the temperature of an edge ring surrounding a plate sample such as a silicon wafer. The technique described in Patent Literature 1 can maintain the edge ring at a constant temperature during processing and stabilize the temperature of an outer periphery of the plate sample. The technique described in Patent Literature 1 also achieves uniform etching characteristics across the surface of the plate sample and prevents deposits on the edge ring.

CITATION LIST

Patent Literature

Patent Literature 1: Japanese Unexamined Patent Application Publication No. 2011-124377

BRIEF SUMMARY

One or more aspects of the present disclosure are directed to a technique for controlling the etching rate at an outer periphery of a substrate being processed.

A substrate support according to an aspect of the present disclosure includes a substrate support portion that supports a substrate, and an edge ring support that supports an edge ring surrounding the substrate supported on the substrate support portion. The edge ring support includes a plurality of heating elements arranged in a circumferential direction of the edge ring support and a plurality of heater power feeders. Each of the plurality of heater power feeders is included in a corresponding heating element of the plurality of heating elements to provide power from an external source to the corresponding heating element.

The technique according to the above aspect of the present disclosure allows control of the etching rate at an outer periphery of a substrate being processed.

DETAILED DESCRIPTION

Figure 1:
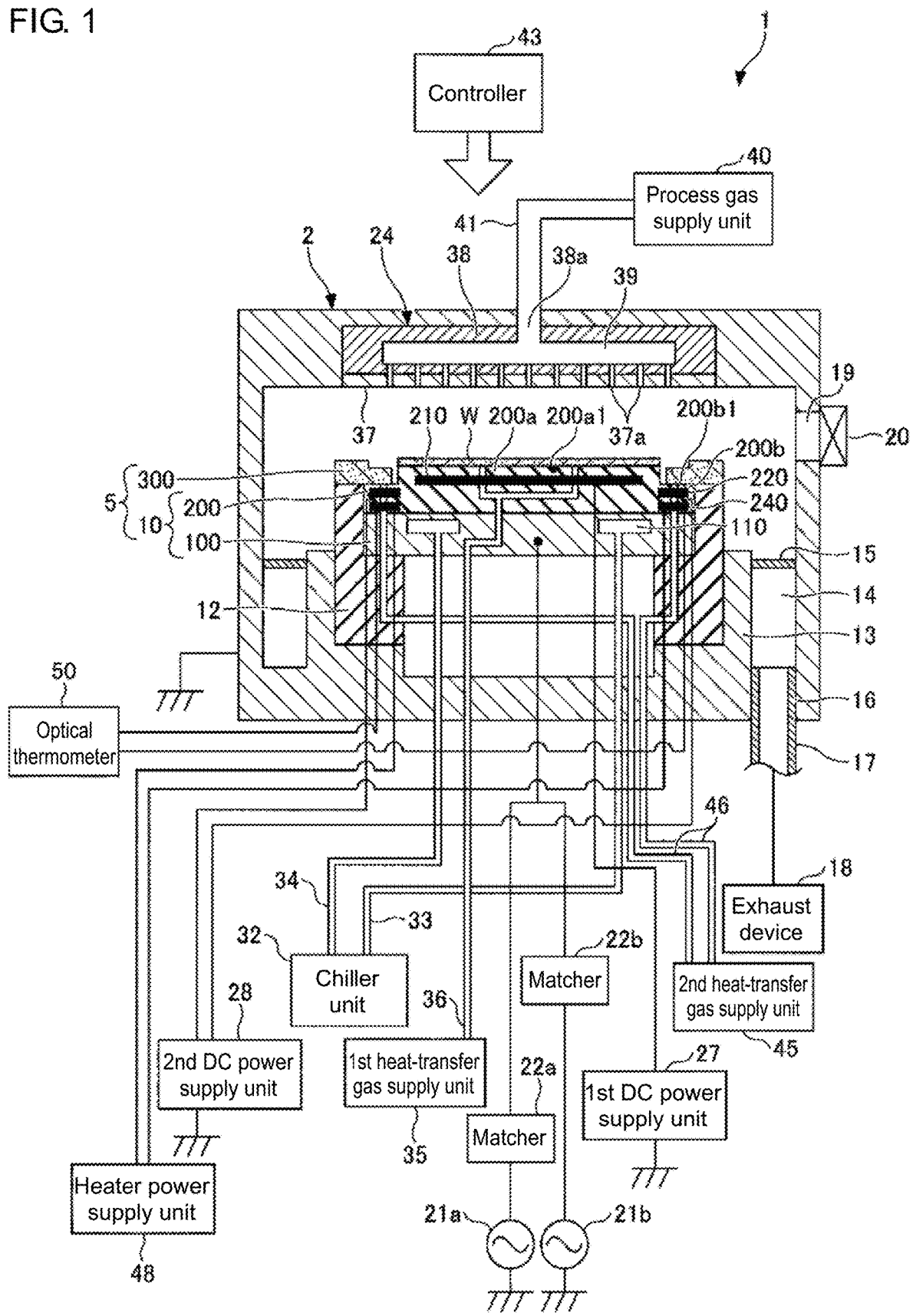
FIG. 1 is a schematic cross-sectional view of a substrate processing apparatus according to an embodiment.

Exemplary embodiments of the present disclosure will now be described with reference to the drawings. In the embodiments described below and the drawings, components indicated by like reference numerals will not be described repeatedly. For ease of understanding, the components in the drawings may not be drawn to scale relative to the actual size of each component. The directions described using terms such as parallel, right-angled, orthogonal, horizontal, perpendicular, vertical, and lateral permit deviations with degrees that can maintain the advantageous effects of the embodiments. Corners herein may be rounded, in addition to being right-angled. Being parallel, right-angled, orthogonal, horizontal, and perpendicular may include being substantially parallel, substantially right-angled, substantially orthogonal, substantially horizontal, and substantially perpendicular.

Overall Structure of Substrate Processing Apparatus 1

An example overall structure of a substrate processing apparatus 1 will first be described with reference to FIG. 1. FIG. 1 is a schematic cross-sectional view of the substrate processing apparatus 1 according to an embodiment. In the present embodiment, the substrate processing apparatus 1 performs reactive ion etching (RIE). However, the substrate processing apparatus 1 may be, for example, a plasma etching apparatus or a plasma chemical vapor deposition (CVD) apparatus.

In FIG. 1, the substrate processing apparatus 1 includes a grounded, cylindrical process chamber 2 formed from metal such as aluminum or stainless steel. The process chamber 2 accommodates a disk-shaped substrate support 10 onto which a substrate W is placed. The substrate support 10 includes a base 100 and an electrostatic chuck (ESC) 200. The base 100 serves as a lower electrode. The base 100 is formed from, for example, aluminum. The base 100 is supported on a cylindrical support 13 with an insulating cylindrical holder 12 in between. The cylindrical support 13 extends perpendicularly upward from the bottom of the process chamber 2.

An exhaust path 14 is defined between the side wall of the process chamber 2 and the cylindrical support 13. An annular baffle plate 15 is located at the inlet of the exhaust path 14 or at a position along the exhaust path 14. An outlet 16 is located in the bottom of the exhaust path 14. The outlet 16 connects to an exhaust device 18 through an exhaust pipe 17. The exhaust device 18 includes a dry pump and a vacuum pump to reduce the pressure inside the process chamber 2 to a predetermined degree of vacuum. The exhaust pipe 17 includes an automatic pressure control valve (APC), which is a variable butterfly valve. The APC automatically controls the pressure inside the process chamber 2. The process chamber 2 has a gate valve 20 on the side wall for opening and closing a port 19 to load and unload a substrate W.

The base 100 is coupled to a radio frequency (RF) power supply via an impedance matching circuit, or a matcher. In the example shown in FIG. 1, the base 100 is coupled to a first RF power supply 21a via an impedance matching circuit, or a matcher 22a. The base 100 is also coupled to a second RF power supply 21b via an impedance matching circuit, or a matcher 22b. The first RF power supply 21a provides RF power for generating plasma with a predetermined frequency (e.g., 40 MHz) to the base 100. The second RF power supply 21b provides RF power for drawing ions with a predetermined frequency (e.g., 400 kHz) lower than the frequency of the first RF power supply 21a to the base 100.

A shower head 24 also serving as an upper electrode is located on the ceiling of the process chamber 2. This enables RF power with two frequencies from the first RF power supply 21a and the second RF power supply 21b to be provided to between the base 100 and the shower head 24.

The ESC 200 that electrostatically attracts a substrate W is located on the upper surface of the base 100. The ESC 200 includes a disk-shaped substrate attraction portion 200a onto which a substrate W is placed, and an annular edge ring attraction portion 200b surrounding the substrate attraction portion 200a. In the figure, the substrate attraction portion 200a protrudes upward relative to the edge ring attraction portion 200b. The substrate attraction portion 200a has its upper surface being a substrate support surface 200a1 onto which a substrate W is placed. The edge ring attraction portion 200b has its upper surface being an edge ring support surface 200b1 onto which an edge ring 300 is placed. The edge ring support surface 200b1 surrounds the substrate support surface 200a1 and receives the edge ring 300. The edge ring 300 may also be called a focus ring. As described later, the edge ring 300 in the substrate processing apparatus 1 according to the present embodiment includes edge ring pieces 301 to 306.

The substrate attraction portion 200a includes a substrate attraction electrode 210 formed from a conductive film held between a pair of dielectric films. The substrate attraction electrode 210 is electrically coupled to a first direct-current (DC) power supply unit 27. The edge ring attraction portion 200b includes an edge ring attraction electrode 220 formed from a conductive film held between a pair of dielectric films. The edge ring attraction electrode 220 is electrically coupled to a second DC power supply unit 28. As described later, the edge ring attraction portion 200b in the substrate processing apparatus 1 according to the present embodiment includes multiple edge ring attraction electrodes. Each of the edge ring attraction electrodes is coupled to the second DC power supply unit 28. In the present disclosure, electrodes in the edge ring attraction portion 200b are collectively referred to as the edge ring attraction electrode 220, unless they are distinguished from one another.

The edge ring attraction portion 200b includes a heater 240 for heating the edge ring 300. The heater 240 receives power from a heater power supply unit 48 to generate heat. Heat generated by the heater 240 heats the edge ring 300. As described later, the edge ring attraction portion 200b in the substrate processing apparatus 1 according to the present embodiment includes multiple heating wires.

The substrate attraction portion 200a is an example of a substrate support portion. The edge ring attraction portion 200b is an example of an edge ring support.

The substrate processing apparatus 1 according to the present embodiment includes an optical thermometer 50 for measuring the temperature of the edge ring attraction portion 200b. Optical fibers extend from the optical thermometer 50 to the lower surface of the ESC 200. The temperature of the edge ring attraction portion 200b in the ESC 200 is measured using light through the lower surface of the ESC 200. The optical thermometer 50 is an example of a temperature sensor.

The combination of the substrate support 10 and the edge ring 300 may be referred to as a substrate support assembly 5.

The first DC power supply unit 27 and the second DC power supply unit 28 can change the level and polarity of a DC voltage they supply. The first DC power supply unit 27 applies a DC voltage to the substrate attraction electrode 210 as controlled by a controller 43 (described later). The second DC power supply unit 28 applies a DC voltage to the edge ring attraction electrode 220 as controlled by the controller 43. In response to the substrate attraction electrode 210 receiving a voltage applied by the first DC power supply unit 27, the ESC 200 generates an electrostatic force such as a Coulomb force to electrostatically attract and hold a substrate W on the ESC 200. In response to the edge ring attraction electrode 220 receiving a voltage applied by the second DC power supply unit 28, the ESC 200 generates an electrostatic force such as a Coulomb force to electrostatically attract and hold the edge ring 300 on the ESC 200. The second DC power supply unit 28 can apply a different voltage to each of the edge ring attraction electrodes.

Although the ESC 200 in the present embodiment includes the substrate attraction portion 200a integral with the edge ring attraction portion 200b, the substrate attraction portion 200a and the edge ring attraction portion 200b may be separate ESCs. In other words, each of the substrate attraction electrode 210 and the edge ring attraction electrode 220 may be held between separate pairs of dielectric films. Although the edge ring attraction electrode 220 in the present embodiment is a monopolar electrode, the edge ring attraction electrode 220 may be a bipolar electrode. A bipolar electrode attracts the edge ring 300 without plasma being generated.

The base 100 has an internal channel 110 extending, for example, circumferentially. The channel 110 receives a refrigerant, such as cooling water, with a predetermined temperature that is circulated from a chiller unit 32 through pipes 33 and 34. The processing temperature for a substrate W on the ESC 200 and the temperature of the edge ring 300 are controlled by adjusting the temperature of the refrigerant. The refrigerant is an example of a medium (temperature control medium) that is circulated and supplied to the channel 110 for temperature adjustment. The temperature control medium may cool and also heat the base 100 and the substrate W.

The ESC 200 is connected to a first heat-transfer gas supply unit 35 through a gas supply line 36. The first heat-transfer gas supply unit 35 supplies a heat-transfer gas into a space between the substrate attraction portion 200a in the ESC 200 and the substrate W through the gas supply line 36. The ESC 200 is connected to a second heat-transfer gas supply unit 45 through gas supply lines 46. The second heat-transfer gas supply unit 45 supplies a heat-transfer gas into a space between the edge ring attraction portion 200b in the ESC 200 and the edge ring 300 through the gas supply lines 46. The heat-transfer gas may be a thermally conductive gas, such as a helium gas. The second heat-transfer gas supply unit 45 supplies the heat-transfer gas to each of the edge ring pieces.

The heat-transfer gas is supplied into the space between the ESC 200 and the substrate W and the space between the ESC 200 and the edge ring 300. This allows the heat input from plasma into the substrate W or the edge ring 300 to be efficiently transferred to the base 100.

The shower head 24 on the ceiling includes, on its lower surface, an electrode plate 37 having many gas vents 37a, and an electrode support 38 supporting the electrode plate 37 in a detachable manner. The electrode support 38 has an internal buffer chamber 39. A gas inlet 38a communicating with the buffer chamber 39 is connected to a process gas supply unit 40 through a gas supply pipe 41.

The components of the substrate processing apparatus 1 are connected to the controller 43. For example, the exhaust device 18, the first RF power supply 21a, the second RF power supply 21b, the matcher 22a, the matcher 22b, the first DC power supply unit 27, the second DC power supply unit 28, the heater power supply unit 48, the chiller unit 32, the first heat-transfer gas supply unit 35, the second heat-transfer gas supply unit 45, and the process gas supply unit 40 are connected to the controller 43. The optical thermometer 50 is also connected to the controller 43. The controller 43 controls the components of the substrate processing apparatus 1.

The controller 43 includes a storage such as a central processing unit (CPU) (not shown), and reads and executes a program and a process recipe stored in the storage to perform intended processing in the substrate processing apparatus 1. The controller 43 also performs electrostatic attraction processing for electrostatically attracting the edge ring 300. The controller 43 also controls the temperature of the edge ring 300 by controlling the heater 240.

In the substrate processing apparatus 1, the gate valve 20 is first open. A substrate W as a workpiece is then loaded into the process chamber 2 and placed onto the ESC 200. Subsequently in the substrate processing apparatus 1, a process gas from the process gas supply unit 40 is introduced into the process chamber 2 at a predetermined flow rate and with a predetermined flow rate ratio. The process gas is a mixed gas containing, for example, an octafluorocyclobutane gas, an oxygen gas, and an argon gas. In the substrate processing apparatus 1, the pressure inside the process chamber 2 is regulated at a predetermined value using, for example, the exhaust device 18.

In the substrate processing apparatus 1, the first RF power supply 21a and the second RF power supply 21b each provide RF power with different frequencies to the base 100. In the substrate processing apparatus 1, the first DC power supply unit 27 applies a DC voltage to the substrate attraction electrode 210 in the ESC 200 to attract the substrate W to the ESC 200. In the substrate processing apparatus 1, the second DC power supply unit 28 applies a DC voltage to the edge ring attraction electrode 220 in the ESC 200 to attract the edge ring 300 to the ESC 200. Plasma is generated from a process gas discharged from the shower head 24. The substrate W is processed with radicals or ions contained in the generated plasma.

Attracting Edge Ring 300

Figure 2:
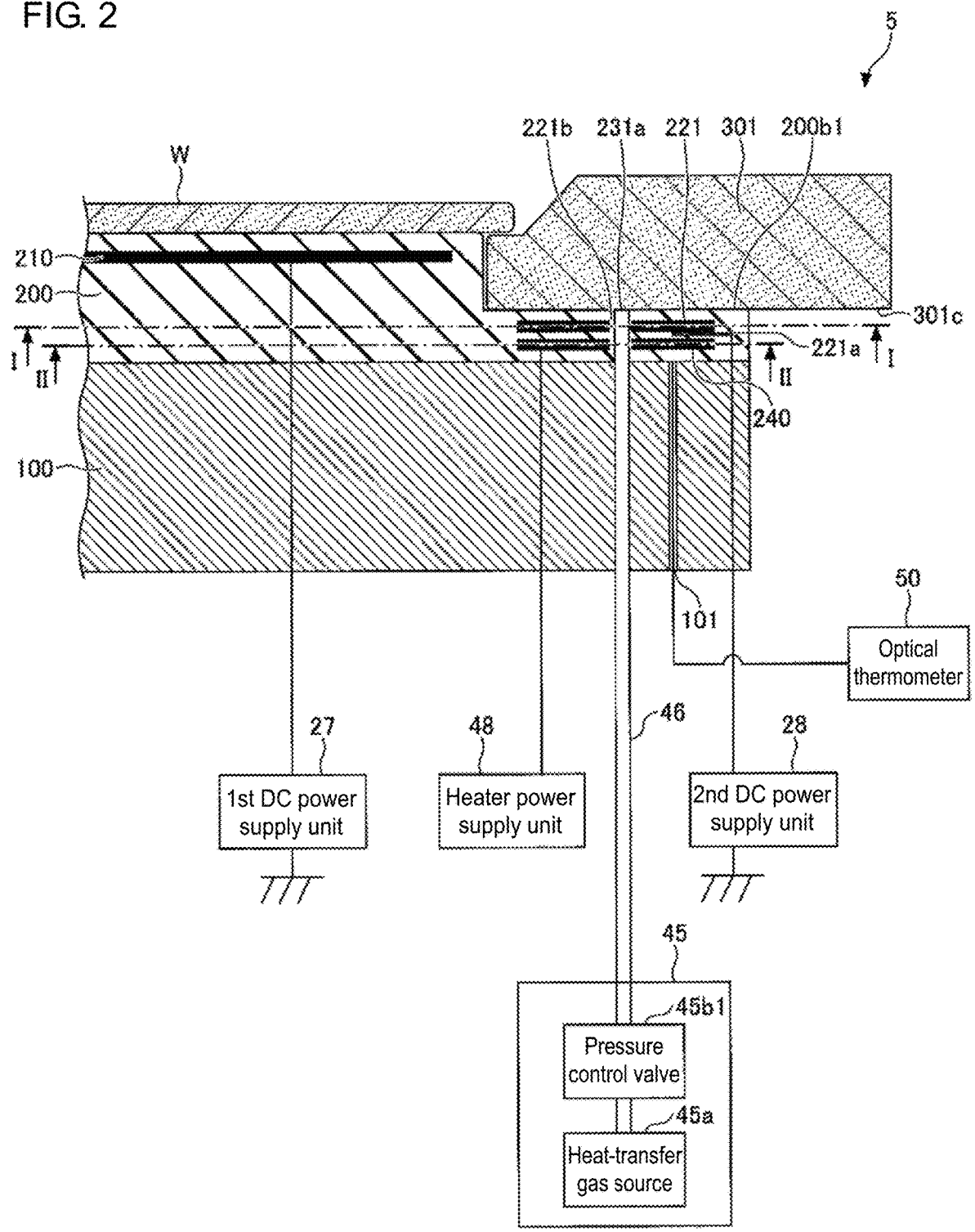
FIG. 2 is an enlarged cross-sectional view of the substrate processing apparatus according to the embodiment, showing a portion including an edge ring.

Attracting the edge ring 300 will now be described. FIG. 2 is an enlarged cross-sectional view of the substrate processing apparatus 1 according to the present embodiment, showing a portion including the edge ring 300. In one example, the substrate processing apparatus 1 according to the present embodiment includes the multiple edge ring pieces 301 to 306, which are circumferentially split from one another. The substrate processing apparatus 1 includes edge ring attraction electrodes 221 to 226 corresponding to the respective edge ring pieces 301 to 306 (refer to FIGS. 3 and 5). The edge ring piece 301 and the edge ring attraction electrode 221 will now be described selectively from the edge ring pieces 301 to 306 and the respective edge ring attraction electrodes 221 to 226.

The edge ring attraction electrode 221 attracts the edge ring piece 301 to the ESC 200. The edge ring attraction electrode 221 includes a power feeder 221a that receives a voltage from the second DC power supply unit 28. The edge ring attraction electrode 221 has a through-hole 221b through which the gas supply line 46 extends.

The ESC 200 has, in the edge ring support surface 200b1, a heat-transfer gas supply hole 231a through which the heat-transfer gas from the gas supply line 46 is supplied.

The heat-transfer gas supply hole 231a receives the heat-transfer gas from the second heat-transfer gas supply unit 45 through the gas supply line 46. The second heat-transfer gas supply unit 45 includes a heat-transfer gas source 45a and a pressure control valve 45b1. As described later, the second heat-transfer gas supply unit 45 includes pressure control valves 45b1 to 45b6 corresponding to the respective edge ring pieces 301 to 306. One edge ring piece 301 will be described with reference to FIG. 2.

The heat-transfer gas supplied into the heat-transfer gas supply hole 231a is supplied to between a back surface 301c of the edge ring piece 301 and the edge ring support surface 200b1 through a heat-transfer gas groove 231 (refer to FIG. 4) on the edge ring support surface 200b1.

The heater 240 is located under the edge ring attraction electrode 221. The heater 240 includes heating wires and supply portions (described later) (refer to FIG. 6). In FIG. 2, the heating wires are not shown in detail.

Edge Ring 300 in Substrate Processing Apparatus 1

Figure 3:
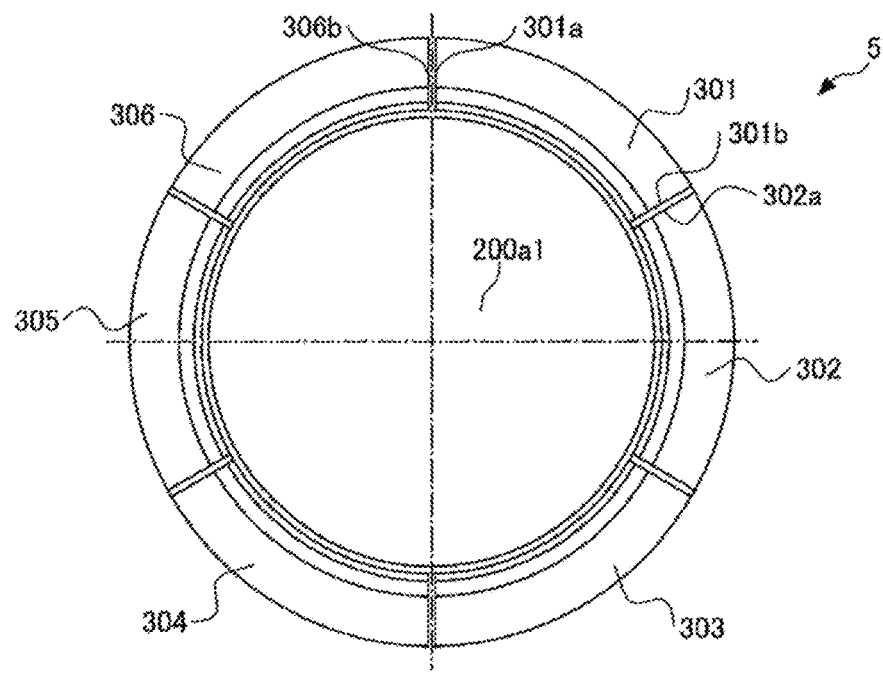
FIG. 3 is a top view of a substrate support assembly in the substrate processing apparatus according to the embodiment.

FIG. 3 is a top view of the substrate support assembly 5 in the substrate processing apparatus 1 according to the present embodiment. The substrate support assembly 5 includes the edge ring 300 that is placed on and is attracted to the edge ring support surface 200b1 of the ESC 200. In one example, the edge ring 300 includes multiple edge ring pieces. More specifically, the substrate support assembly 5 includes six edge ring pieces 301 to 306.

In one example, the edge ring pieces 301 to 306 are located at equal intervals and surround the substrate support surface 200a1, or in other words, the substrate W. In this case, the edge ring pieces 301 to 306 may have the same shape. At least two edge ring pieces may be used to entirely cover the edge ring support surface 200b1. To reduce the amount of a heat-transfer gas leak and to maintain workability, three to nine, or more specifically, four to eight edge ring pieces may be used. Each of the edge ring pieces 301 to 306 may have a different shape. The edge ring pieces 301 to 306 may be located at unequal intervals around the edge ring support surface 200b1.

Edge Ring Support Surface 200b1 in ESC 200

Figure 4:
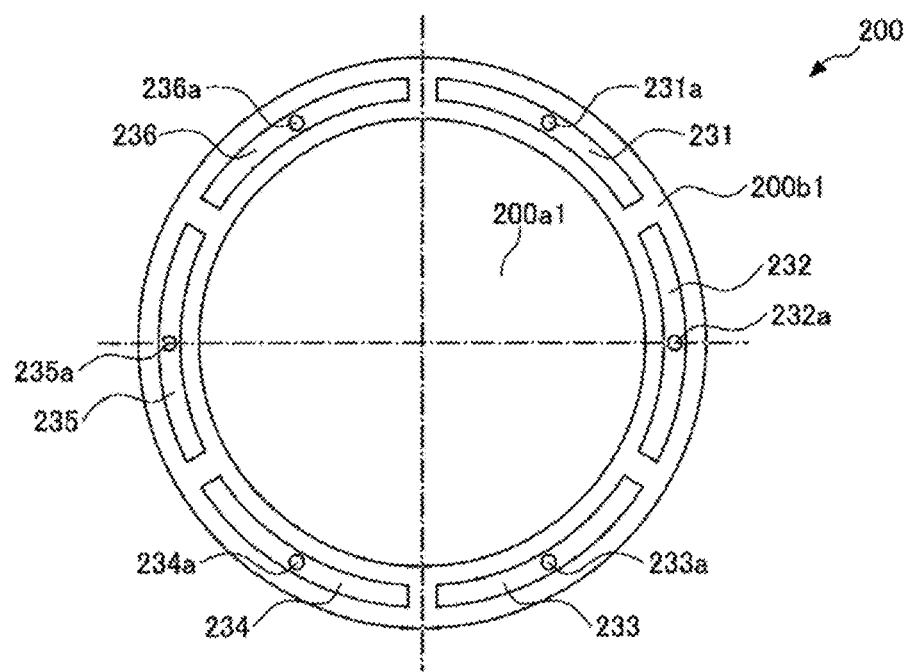
FIG. 4 is a top view of an electrostatic chuck (ESC) in the substrate processing apparatus according to the embodiment.

The edge ring support surface 200b1 of the ESC 200 (edge ring attraction portion 200b) will now be described. FIG. 4 is a top view of the ESC 200 in the substrate processing apparatus 1 according to the present embodiment.

The ESC 200 has, on the edge ring support surface 200b1, heat-transfer gas grooves 231 to 236 corresponding to the respective edge ring pieces 301 to 306. More specifically, the ESC 200 has the heat-transfer gas groove 231 in an area (a portion facing the back surface of the edge ring piece 301) to which the edge ring piece 301 is attracted. Similarly, the edge ring attraction portion 200b has the heat-transfer gas grooves 232, 233, 234, 235, and 236 in respective portions facing the back surfaces of the respective edge ring pieces 302, 303, 304, 305, and 306.

The heat-transfer gas grooves 231 to 236 are recessed in a direction perpendicular to the edge ring support surface 200b1. The heat-transfer gas grooves 231 to 236 have respective heat-transfer gas supply holes 231a to 236a. The heat-transfer gas supplied through the heat-transfer gas supply hole 231a fills a space between the edge ring piece 301 and the heat-transfer gas groove 231. The same applies to the edge ring pieces 302 to 306 and the heat-transfer gas grooves 232 to 236.

The heat-transfer gas grooves 231 to 236 have the respective heat-transfer gas supply holes 231a to 236a, which are separate from one another. This allows supply of the heat-transfer gas separately to each of the heat-transfer gas grooves 231 to 236. Each heat-transfer gas groove may not be arch-shaped, but may be split radially or circumferentially when the heat-transfer gas groove communicates with its respective heat-transfer gas supply hole.

The substrate processing apparatus 1 according to the present embodiment can independently control the pressure of the heat-transfer gas supplied into each of the heat-transfer gas grooves 231 to 236. The pressure of the heat-transfer gas supplied into each of the heat-transfer gas grooves 231 to 236 is independently controlled to control the amount of a heat-transfer gas leak. Controlling the pressure of the heat-transfer gas and controlling (reducing) the amount of a heat-transfer gas leak stabilize the temperatures of the edge ring pieces 301 to 306.

Edge Ring Attraction Electrode 220 in ESC 200

Figure 5:
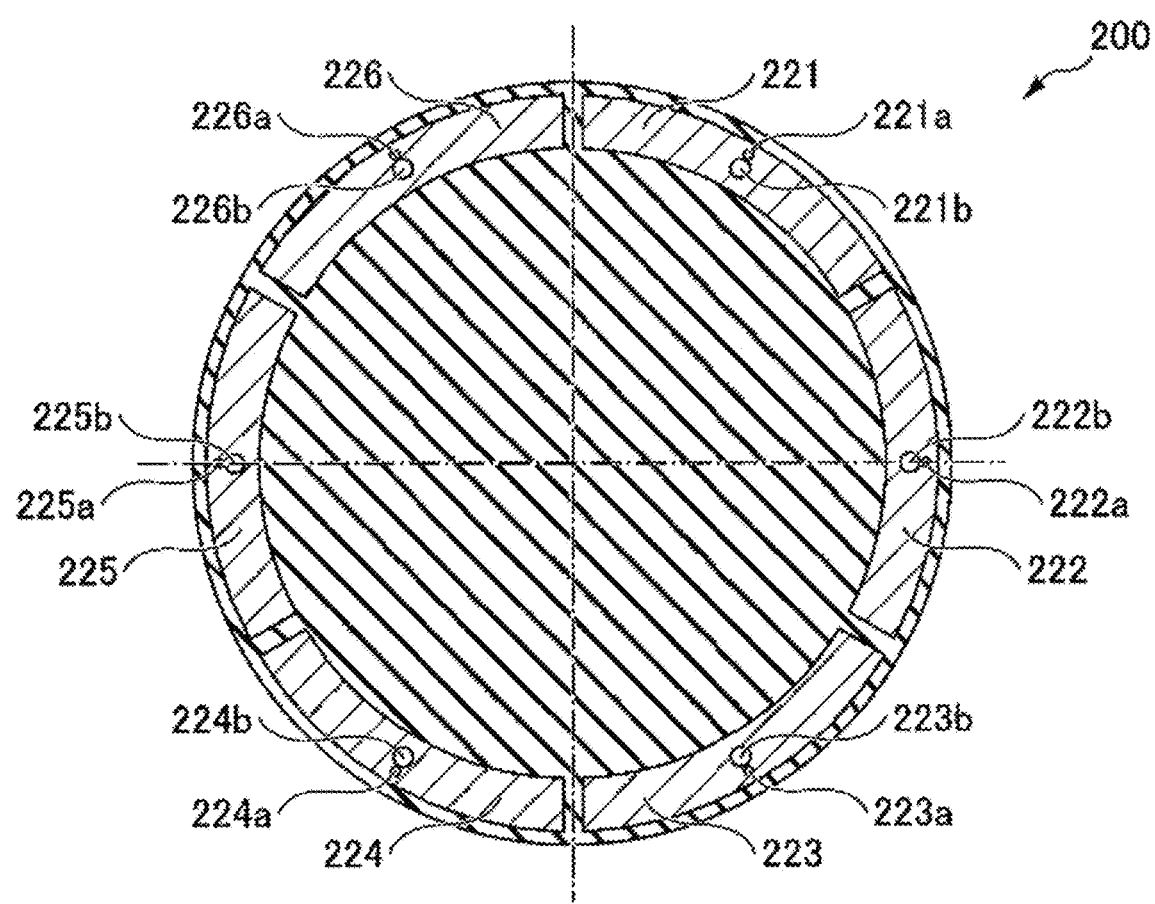
FIG. 5 is a cross-sectional view of the ESC in the substrate processing apparatus according to the embodiment.

The edge ring attraction electrode 220 in the ESC 200 will now be described. FIG. 5 is a cross-sectional view of the ESC 200 in the substrate processing apparatus 1 according to the present embodiment. More specifically, FIG. 5 is a cross-sectional view of the ESC 200 taken along a plane I-I parallel to the edge ring support surface 200b1, showing the edge ring attraction electrode 220 in the ESC 200 shown in FIG. 2.

The ESC 200 includes the edge ring attraction electrodes 221 to 226 corresponding to the respective edge ring pieces 301 to 306. More specifically, the ESC 200 internally includes the edge ring attraction electrode 221 in an area (a portion facing the back surface of the edge ring piece 301) to which the edge ring piece 301 is attracted. Similarly, the ESC 200 internally includes the edge ring attraction electrodes 222, 223, 224, 225 and 226 in respective portions facing the back surfaces of the respective edge ring pieces 302, 303, 304, 305, and 306.

The edge ring attraction electrodes 221 to 226 include respective power feeders 221a to 226a that receive power from the second DC power supply unit 28. The edge ring attraction electrodes 221 to 226 have respective through-holes 221b to 226b through which the gas supply lines 46 extend. A ceramic sleeve is fitted inside each of the through-holes 221b to 226b for insulation from the edge ring attraction electrodes 221 to 226. The edge ring attraction electrodes 221 to 226 include the respective power feeders 221a to 226a, which are separate from one another. This allows supply (application) of a voltage separately to each of the edge ring attraction electrodes 221 to 226.

The application voltage applied to each of the edge ring attraction electrodes 221 to 226 is controlled to control the amount of a heat-transfer gas leak. Controlling the application voltage and controlling (reducing) the amount of a heat-transfer gas leak stabilize the temperatures of the edge ring pieces 301 to 306. Each of the edge ring attraction electrodes 221 to 226 is an example of an attraction electrode.

Heater 240 in ESC 200

Figure 6:
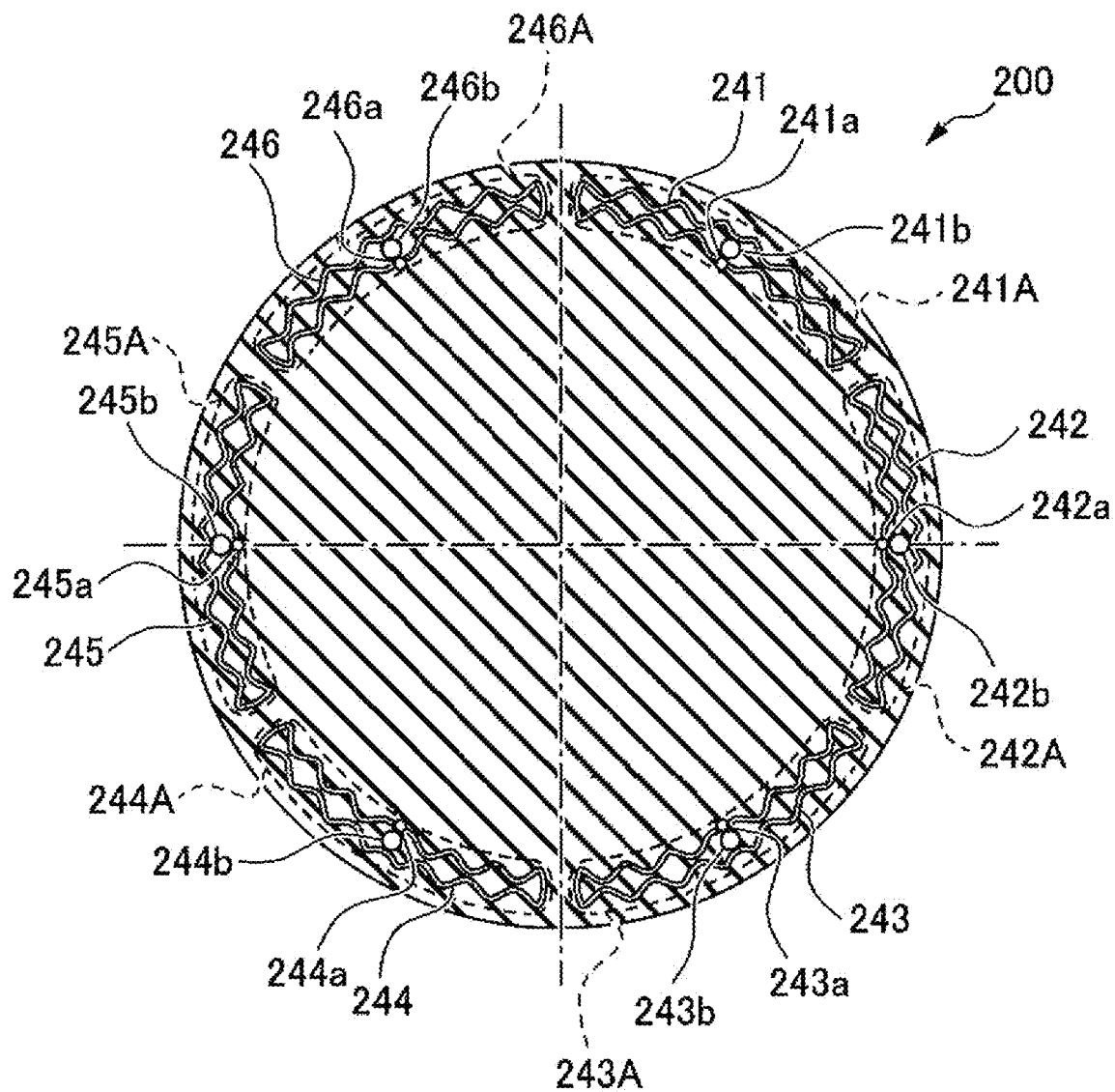
FIG. 6 is a cross-sectional view of the ESC in the substrate processing apparatus according to the embodiment.

The heater 240 in the ESC 200 will now be described. FIG. 6 is a cross-sectional view of the ESC 200 in the substrate processing apparatus 1 according to the present embodiment. More specifically, FIG. 6 is a cross-sectional view of the ESC 200 taken along a plane II-II parallel to the edge ring support surface 200b1, showing the heater 240 in the ESC 200 shown in FIG. 2.

The edge ring attraction portion 200b in the ESC 200 includes, in respective split sections 241A to 246A defined by circumferentially dividing the edge ring attraction portion 200b, respective heating wires 241 to 246 that generate heat by carrying a current from one end to the other end of the heating wire. The heating wire is an example of a heating element. The edge ring attraction portion 200b includes, in respective split sections defined by circumferentially dividing the area onto which the edge ring 300 is placed, respective heating wires.

More specifically, the edge ring attraction portion 200b includes the heating wire 241 in the split section 241A. Similarly, the edge ring attraction portion 200b includes, in the respective split sections 242A to 246A, the respective heating wires 242 to 246.

The heating wires 241 to 246 are arranged in the circumferential direction of the edge ring attraction portion 200b.

The heating wires 241 to 246 correspond to the respective edge ring pieces 301 to 306. More specifically, the ESC 200 includes the heating wire 241 in an area (a portion facing the back surface of the edge ring piece 301) to which the edge ring piece 301 is attracted. Similarly, the ESC 200 internally includes the heating wires 242 to 246 in respective portions facing the back surfaces of the respective edge ring pieces 302 to 306.

The heating wires 241 to 246 each generate heat by carrying a current from one end to the other end of the heating wire. The heating wires 241 to 246 each generate heat to heat the edge ring pieces 301 to 306. The heating wires 241 to 246 include respective heater power feeders 241a to 246a that receive power from the heater power supply unit 48. The heater power feeders 241a to 246a input power into one end of the respective heating wires 241 to 246 and output the power from the other end.

FIG. 6 shows through-holes 241b to 246b through which the gas supply lines 46 extend. The heating wires 241 to 246 include the respective heater power feeders 241a to 246a, which are separate from one another. This allows supply (application) of power for the heater separately to each of the heating wires 241 to 246. The heating wires 241 to 246 are located in the respective split sections defined by circumferentially dividing the edge ring attraction portion 200b.

The application voltage applied to each of the heating wires 241 to 246 is controlled to control the temperature of the edge ring 300. The temperature of the edge ring 300 is controlled to control the etching rate of a substrate being processed.

Although the heating wires 241 to 246 in the present embodiment are located at positions corresponding to the respective edge ring pieces 301 to 306, the heating wires may be located at positions circumferentially shifted from the respective edge ring pieces.

The heating wires 241 to 246 in the present embodiment may each have a shape other than the meandering shape shown in FIG. 6. For example, the width and intervals of turns of the heating wires may be changed as appropriate. In another embodiment, for example, the heating wires may be shaped in polygonal lines combining straight lines. The heating wires may include multiple layers stacked on one another in a direction perpendicular to the edge ring support surface 200b1. Heating wires in the multiple layers may have, for example, different shapes between in an upper layer and in a lower layer. In another embodiment, for example, one layer in the multiple layers may have heating wires arranged concentrically, instead of being arranged circumferentially, and another layer in the multiple layers may have heating wires arranged circumferentially.

Supply of Heat-Transfer Gas to ESC 200

Figure 7:
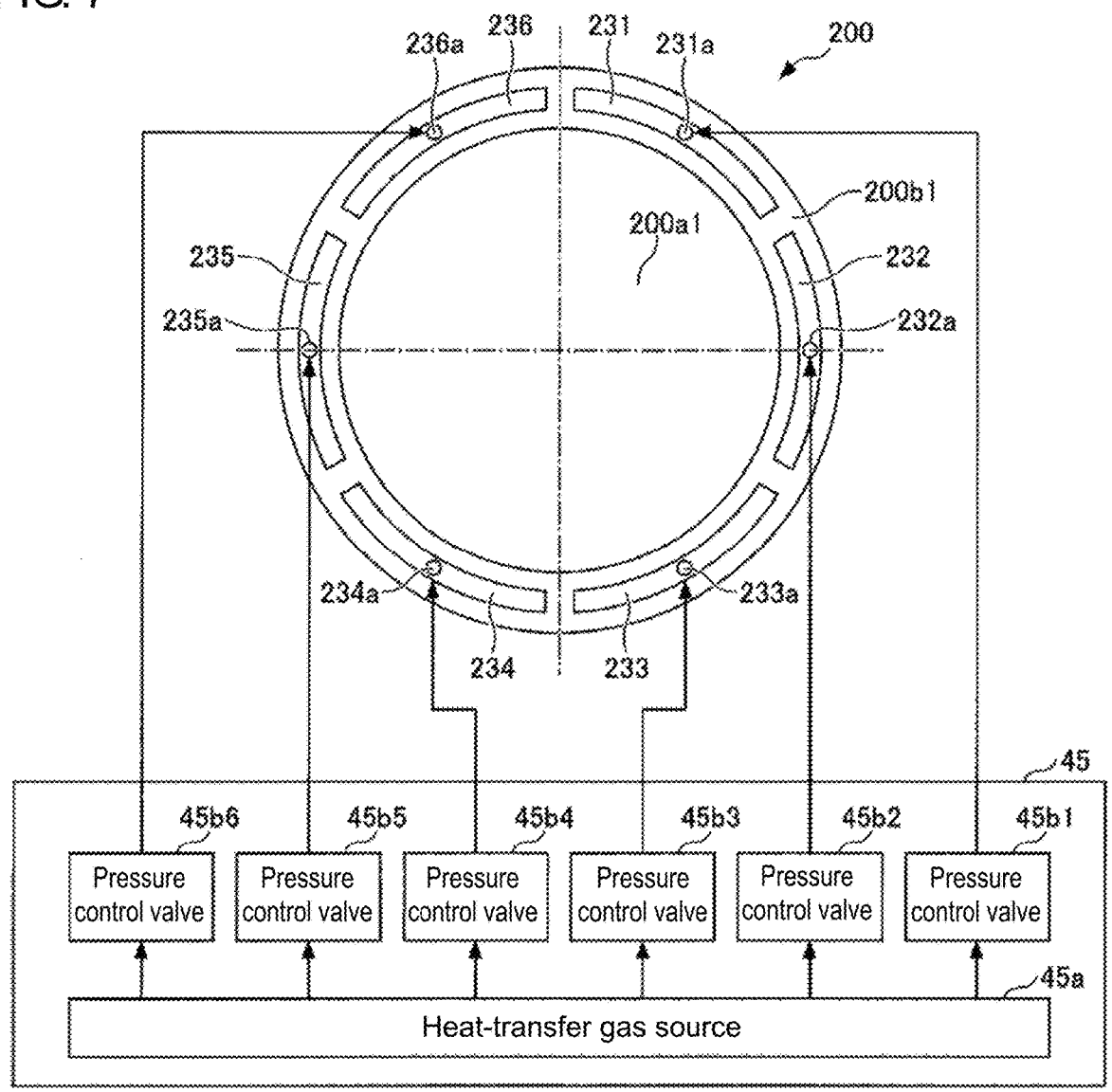
FIG. 7 is a diagram describing supply of a heat-transfer gas to the ESC in the substrate processing apparatus according to the embodiment.

An example method for controlling the substrate support assembly 5 will now be described. Supply of the heat-transfer gas to the ESC 200 will now be described. FIG. 7 is a diagram describing supply of the heat-transfer gas to the ESC 200 in the substrate processing apparatus 1 according to the present embodiment.

The heat-transfer gas supply holes 231a to 236a in the heat-transfer gas grooves 231 to 236 corresponding to the respective edge ring pieces 301 to 306 are connected to the second heat-transfer gas supply unit 45. The second heat-transfer gas supply unit 45 includes the pressure control valves 45b1 to 45b6 corresponding to the respective heat-transfer gas grooves 231 to 236. The controller 43 can set the pressure for each of the pressure control valves 45b1 to 45b6. The pressure control valves 45b1 to 45b6 each control the pressure of the heat-transfer gas to be supplied to be at a set pressure value. The heat-transfer gas supplied to the ESC 200 is controlled to control the substrate support assembly 5.

The controller 43 may set the same set pressure value for each of the pressure control valves 45b1 to 45b6. In another embodiment, the set pressure value for each of the pressure control valves 45b1 to 45b6 may be changed in accordance with a result of substrate processing performed in the substrate processing apparatus 1. For example, the set pressure value for a pressure control valve corresponding to an edge ring piece near an area with a faster processing rate may be changed (increased in an example) to decrease the processing rate. The controller 43 may change the set pressure value for each of the pressure control valves 45b1 to 45b6 based on the temperature of each of the edge ring pieces 301 to 306. For example, the set pressure value for a pressure control valve corresponding to an edge ring piece with a higher temperature may be changed (increased in an example).

Provision of Attracting Power to ESC 200

Figure 8:
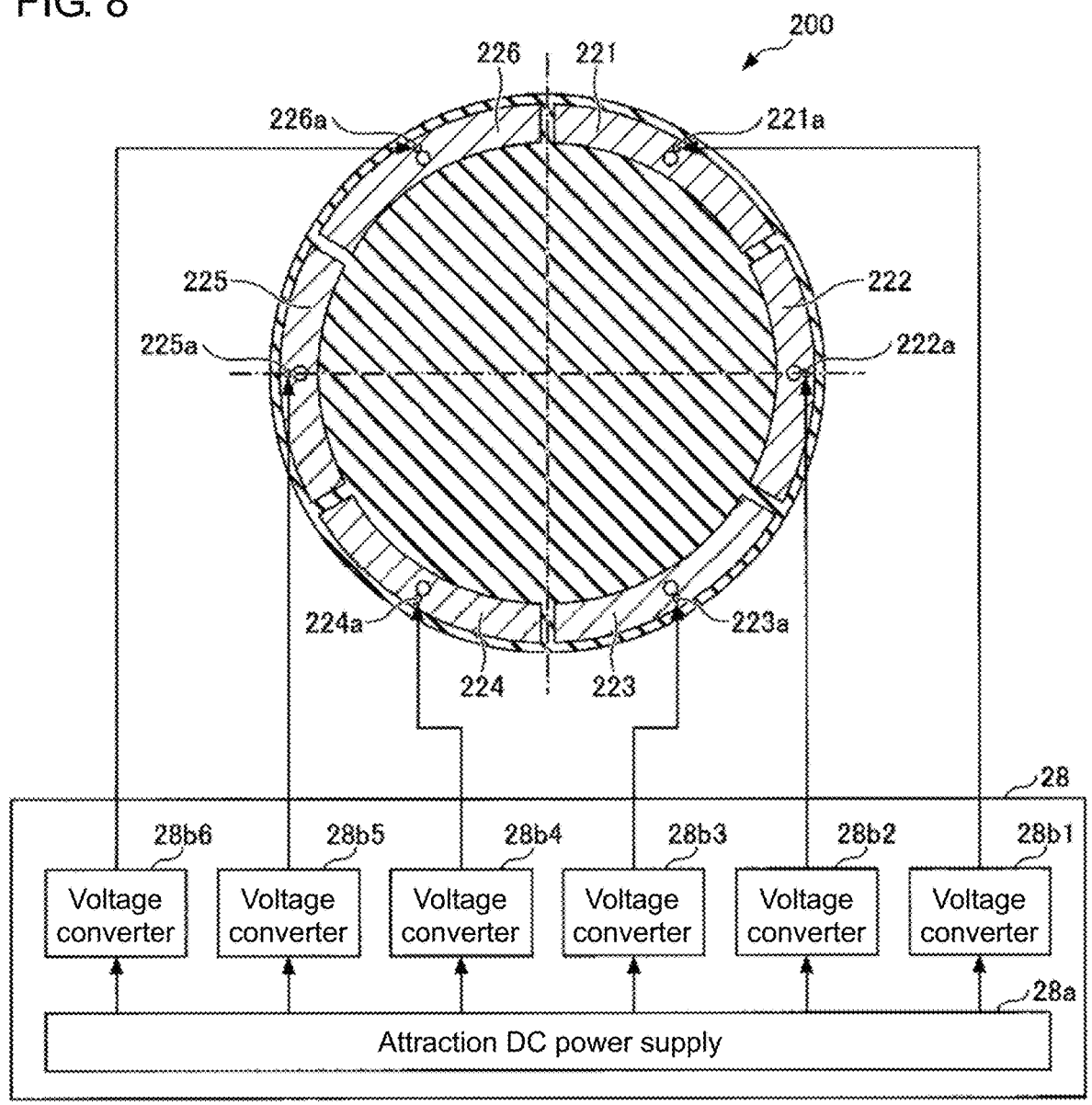
FIG. 8 is a diagram describing provision of attracting power to the ESC in the substrate processing apparatus according to the embodiment.

An example method for controlling the substrate support assembly 5 will now be described. Providing attracting power to the ESC 200 will now be described. FIG. 8 is a diagram describing provision of attracting power to the ESC 200 in the substrate processing apparatus 1 according to the present embodiment.

The edge ring attraction electrodes 221 to 226 corresponding to the respective edge ring pieces 301 to 306 are coupled to the second DC power supply unit 28. The second DC power supply unit 28 includes an attraction DC power supply 28a that provides DC power to each of the edge ring attraction electrodes 221 to 226, and voltage converters 28b1 to 28b6 corresponding to the respective edge ring attraction electrodes 221 to 226. The controller 43 can set the voltage to be output from each of the voltage converters 28b1 to 28b6. The voltage converters 28b1 to 28b6 each control the voltage to be output from the voltage converter to be at a set voltage value. The power provided to the ESC 200 is controlled to control the substrate support assembly 5.

Provision of Heater Power to ESC 200

Figure 9:
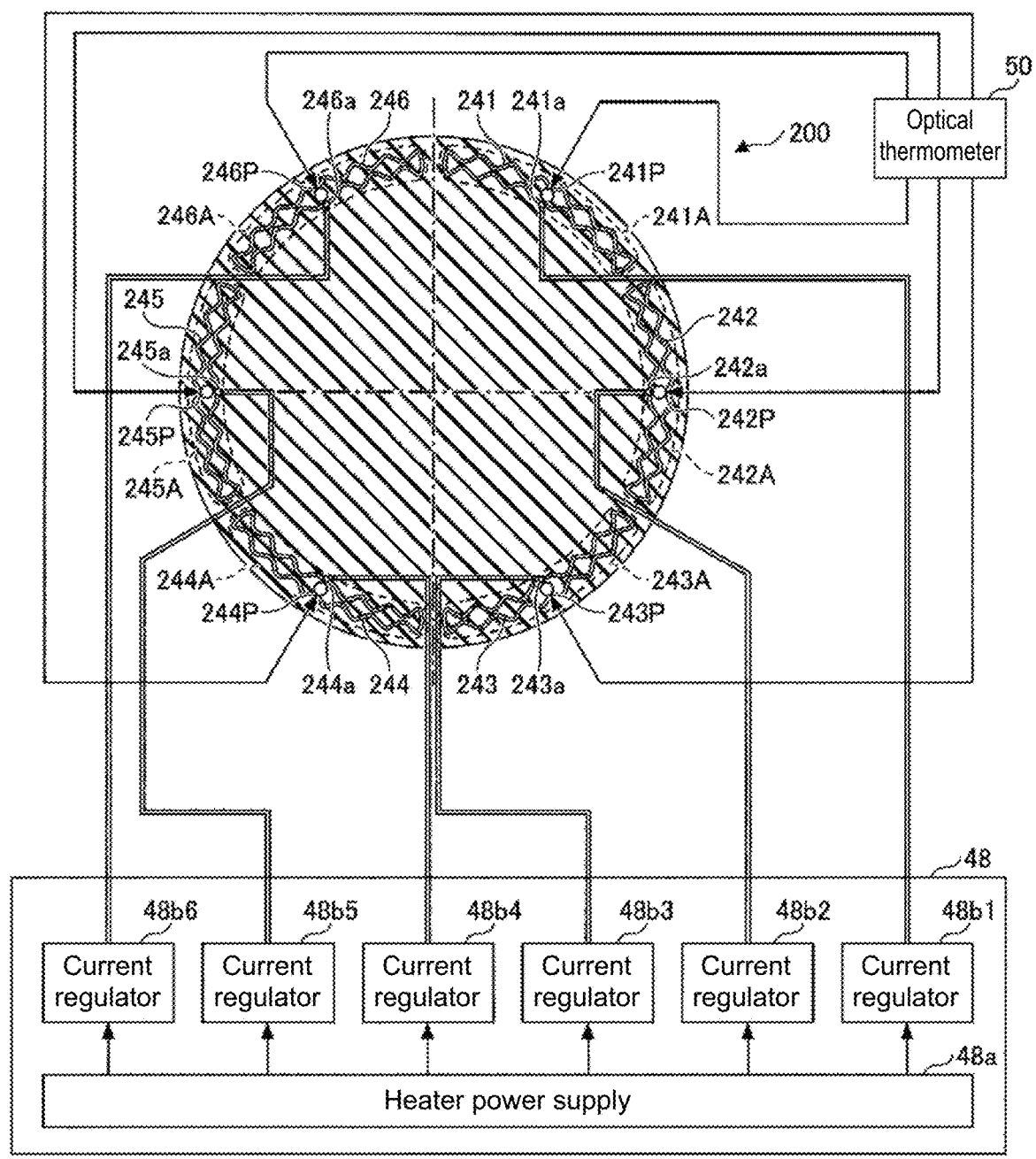
FIG. 9 is a diagram describing provision of power to a heater in the substrate processing apparatus according to the embodiment and temperature measurement.

An example method for controlling the substrate support assembly 5 will now be described. Providing heater power to the ESC 200 will now be described. FIG. 9 is a diagram describing provision of heater power to the heater 240 in the substrate processing apparatus 1 according to the present embodiment and temperature measurement.

The heating wires 241 to 246 corresponding to the respective edge ring pieces 301 to 306 are coupled to the heater power supply unit 48 through the heater power feeders 241a to 246a. The heater power supply unit 48 includes a heater power supply 48a and current regulators 48b1 to 48b6 corresponding to the respective heating wires 241 to 246. The controller 43 can set the power (current) to be output from each of the current regulators 48b1 to 48b6. The current regulators 48b1 to 48b6 each control the power (current) to be output from the current regulator to be at a set power (current) value. The heater power provided to the ESC 200 is controlled to control the substrate support assembly 5. The heater power supply 48a may provide alternating-current (AC) power or DC power.

The optical thermometer 50 measures the temperature of each of the split sections 241A to 246A of the ESC 200. For example, the optical thermometer 50 measures the temperature of a measurement point 241P in the split section 241A. Similarly, the optical thermometer 50 measures the temperature of each of measurement points 242P to 246P in the respective split sections 242A to 246A.

The temperature sensor for measuring the temperature of each of the split sections 241A to 246A of the ESC 200 is not limited to the optical thermometer 50. For example, a resistance thermometer, a thermocouple, or a thermistor may be used as a temperature sensor other than the optical thermometer. The temperature of each of the split sections 241A to 246A may be measured by measuring the resistance of each of the heating wires 241 to 246. In other words, each of the heating wires 241 to 246 may be used as a temperature sensor.

Distribution of Etching Rates

Figure 10:
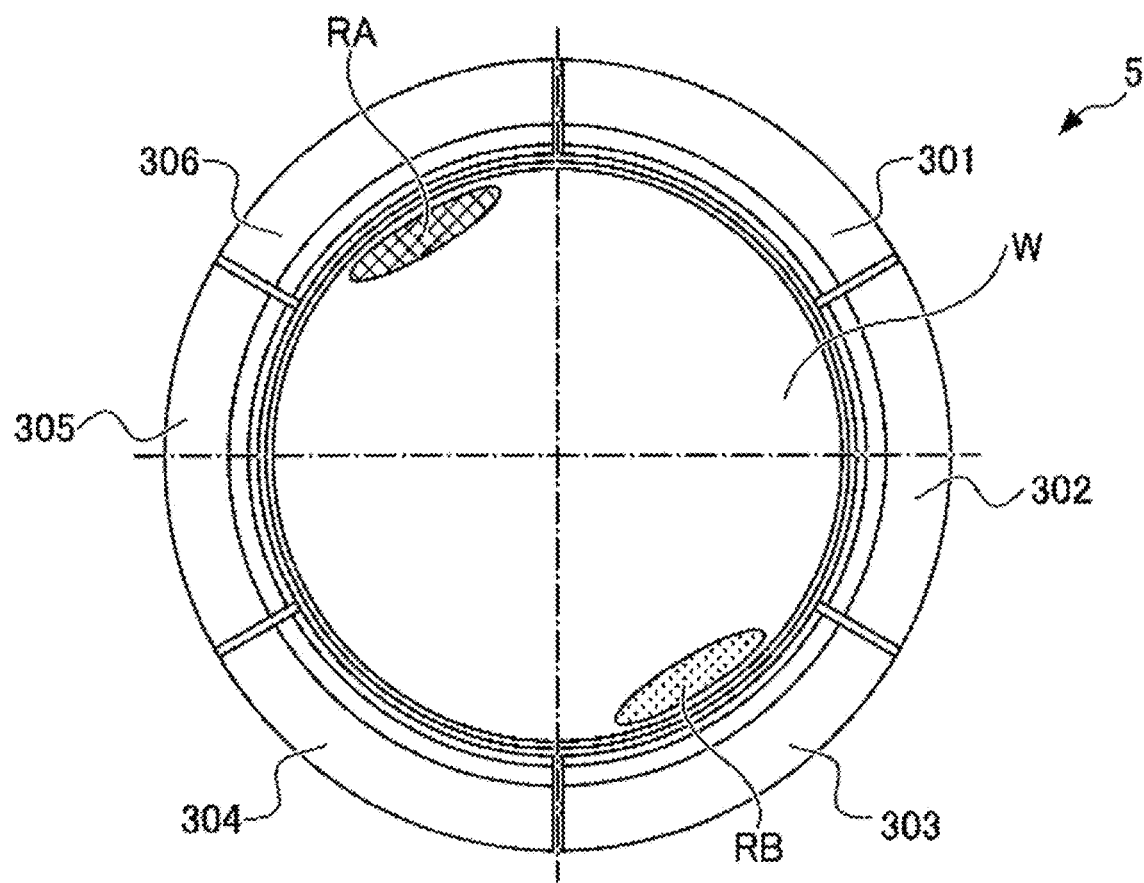
FIG. 10 is a diagram describing example distribution of etching rates in the substrate processing apparatus according to the embodiment.

FIG. 10 is a diagram describing example distribution of etching rates in the substrate processing apparatus 1 according to the present embodiment. In FIG. 10, for example, the etching rate is to be increased in an area RA on the substrate W (wafer). In FIG. 10, the etching rate is to be decreased in an area RB on the substrate W (wafer).

The area RA on the substrate W (wafer) will be described first. To increase the etching rate in the area RA on the substrate W (wafer), the temperature of the edge ring piece 306 near the area RA is decreased. To decrease the temperature of the edge ring piece 306, provision of power to the heating wire 246 below the edge ring piece 306 is reduced. The reduced provision of power to the heating wire 246 reduces the amount of heat generated by the heating wire 246. The reduced amount of heat generated by the heating wire 246 decreases the temperature of the edge ring piece 306.

The decreased temperature of the edge ring piece 306 can increase the etching rate in the area RA on the substrate W (wafer) near the edge ring piece 306. The phenomenon described above is an example. Decreasing the temperature of an edge ring piece may decrease the etching rate depending on the compositions (material) of the film included in the substrate W. In this case, the etching rate can be increased by increasing the temperature of the edge ring piece.

The area RB on the substrate W (wafer) will now be described. To decrease the etching rate in the area RB on the substrate W (wafer), the temperature of the edge ring piece 303 near the area RB is increased. To increase the temperature of the edge ring piece 303, provision of power to the heating wire 243 below the edge ring piece 303 is increased. The increased provision of power to the heating wire 243 increases the amount of heat generated by the heating wire 243. The increased amount of heat generated by the heating wire 243 increases the temperature of the edge ring piece 303.

The increased temperature of the edge ring piece 303 can decrease the etching rate in the area RB on the substrate W (wafer) near the edge ring piece 303. The phenomenon described above is an example. Increasing the temperature of an edge ring piece may increase the etching rate depending on the compositions (material) of the film included in the substrate W. In this case, the etching rate can be decreased by decreasing the temperature of the edge ring piece.

As described above, the edge ring 300 includes the edge ring pieces 301 to 306, which are circumferentially split from one another. Providing heater power to each of the heating wires 241 to 246 below the respective edge ring pieces 301 to 306 is controlled independently. The edge ring including the multiple edge ring pieces and the independent control of power to the heating wires improve the controllability of the edge ring temperature. In other words, the temperature control can be performed for each area corresponding to each of the split edge ring pieces 301 to 306. Controlling the temperature of each edge ring piece allows control of the etching rate of the substrate W near the edge ring piece.

Method for Processing Substrate

Figure 11:
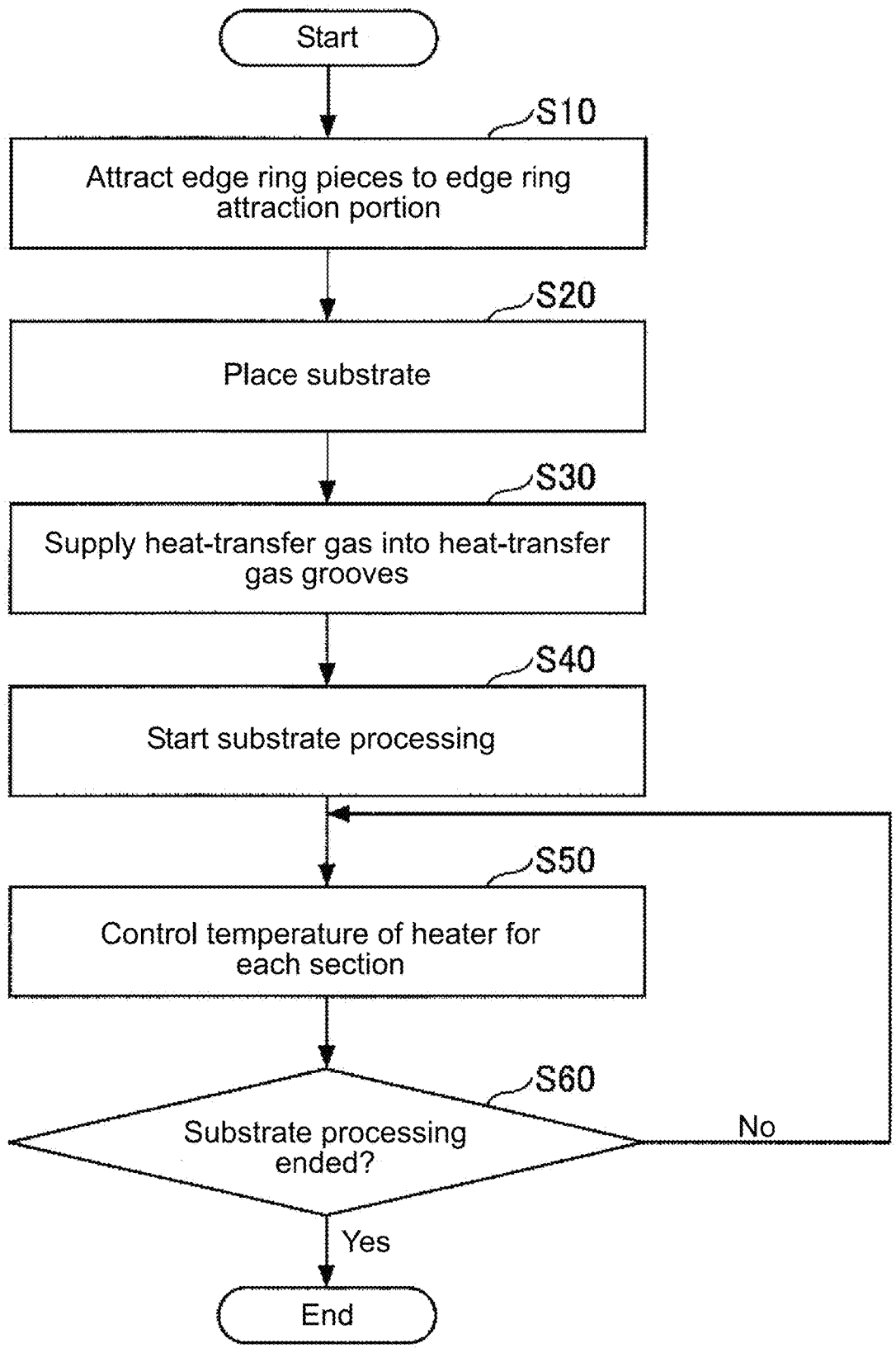
FIG. 11 is a flowchart describing a method for processing a substrate using the substrate processing apparatus according to the embodiment.

A method for processing a substrate using the substrate processing apparatus 1 will now be described. FIG. 11 is a flowchart describing a method for processing a substrate using the substrate processing apparatus 1 according to the present embodiment. More specifically, FIG. 11 is a flowchart of control performed by the controller 43. Each step (or process) will now be described.

Step S10

The controller 43 first controls the edge ring pieces 301, 302, 303, 304, 305, and 306 to be attracted to the edge ring attraction portion 200b.

Step S20

The controller 43 then controls the substrate W (workpiece) to be placed onto the ESC 200.

Step S30

The controller 43 then controls the heat-transfer gas to be supplied into the heat-transfer gas grooves.

Step S40

The controller 43 then starts processing (substrate processing) of the substrate W (wafer). The substrate processing includes etching the substrate W (wafer). In step S40, the controller 43 performs, before starting the substrate processing, temperature control to cause the heating wires 241 to 246 to have a set temperature. The temperature control may be performed before the substrate processing. For example, the temperature control may be performed after step S30 and before step S40 or may be performed before step S30.

Step S50

The controller 43 then controls the temperature of the heater 240 for each section, or each edge ring piece. More specifically, the controller 43 controls the heater power supply unit 48 to control provision of power to each of the heating wires 241 to 246. The controller 43 performs the control based on the temperature of each section obtained by the optical thermometer 50. The power supply to each of the heating wires 241 to 246 is controlled to control the amount of heat generated by each of the heating wires 241 to 246. The temperature of each of the edge ring pieces 301 to 306 is controlled in accordance with the amount of heat generated by each of the heating wires 241 to 246.

For the temperature control, the controller 43 uses the temperature of each of the split sections 241A to 246A measured by the optical thermometer 50. In other words, the controller 43 controls provision of power to each of the heating wires 241 to 246 to set the temperature measured by the optical thermometer 50 to an intended temperature.

Step S60

The controller 43 then determines whether the substrate processing has ended.

When the substrate processing has ended (Yes in step S60), the process ends. When the processing has not ended (No in step S60), the processing is repeated from step S40. The substrate processing is performed in parallel with processes between step S40 and step S60.

Through the processes described above, the temperature of each edge ring piece can be controlled. Controlling the temperature of each edge ring piece allows control of the etching rate of the substrate W near the edge ring piece.

Setting Temperature for Edge Ring

The set temperature for the edge ring may be determined based on, for example, the number of substrates or substrate lots processed by the substrate processing apparatus 1. For example, FIG. 12 is a graph showing the number of substrates processed by the substrate processing apparatus 1 according to the present embodiment and the percentage of change in the etching rate.

Figure 12:
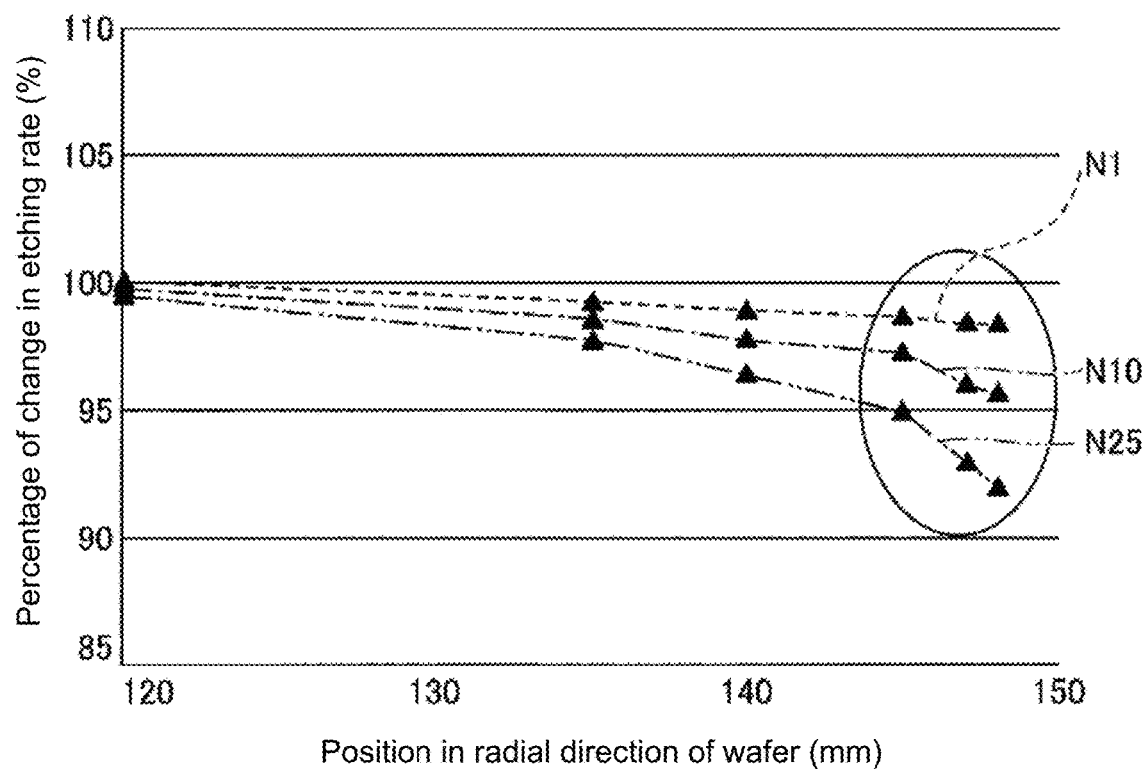
FIG. 12 is a graph showing the number of substrates processed by the substrate processing apparatus according to the embodiment and the percentage of change in the etching rate.

In the graph of FIG. 12, the horizontal axis indicates the position in the radial direction of the processed wafer, and the vertical axis indicates the percentage of change in the etching rate. The percentage of change in the etching rate indicates the percentage of change in the etching rate from a target etching rate being 100%.

The line N1 indicates the percentage of change in the etching rate of a wafer (first processed wafer) when the substrate processing is performed on a single wafer. The line N10 indicates the percentage of change in the etching rate of a wafer (tenth processed wafer) when the substrate processing is performed on ten wafers. The line N25 indicates the percentage of change in the etching rate of a wafer (25th processed wafer) when the substrate processing is performed on 25 wafers.

The etching rate of a wafer, specifically, at edge portions decreases as the number of processed wafers increases. The etching rate of a wafer decreases as the number of processed wafers increases. This results from an increase in the temperature of the edge ring due to the substrate processing. FIG. 12 shows the results of an experiment conducted for the percentage of change with no edge ring attracted and no supply of a cooling gas.

When the correlation between the etching rate and the number of wafers (number of processed wafers) processed through the substrate processing is known, the set temperature for the edge ring may be changed based on data about the correlation between the etching rate and the number of wafers (number of processed wafers) processed through substrate processing. The number of wafers (number of processed wafers) processed through substrate processing represents the time taken to perform substrate processing, or in other words, the substrate processing time. The temperature for the edge ring may thus be set based on the correlation between the etching rate and the substrate processing time.

Modifications

First Modification of Method for Processing Substrate

Figure 13:
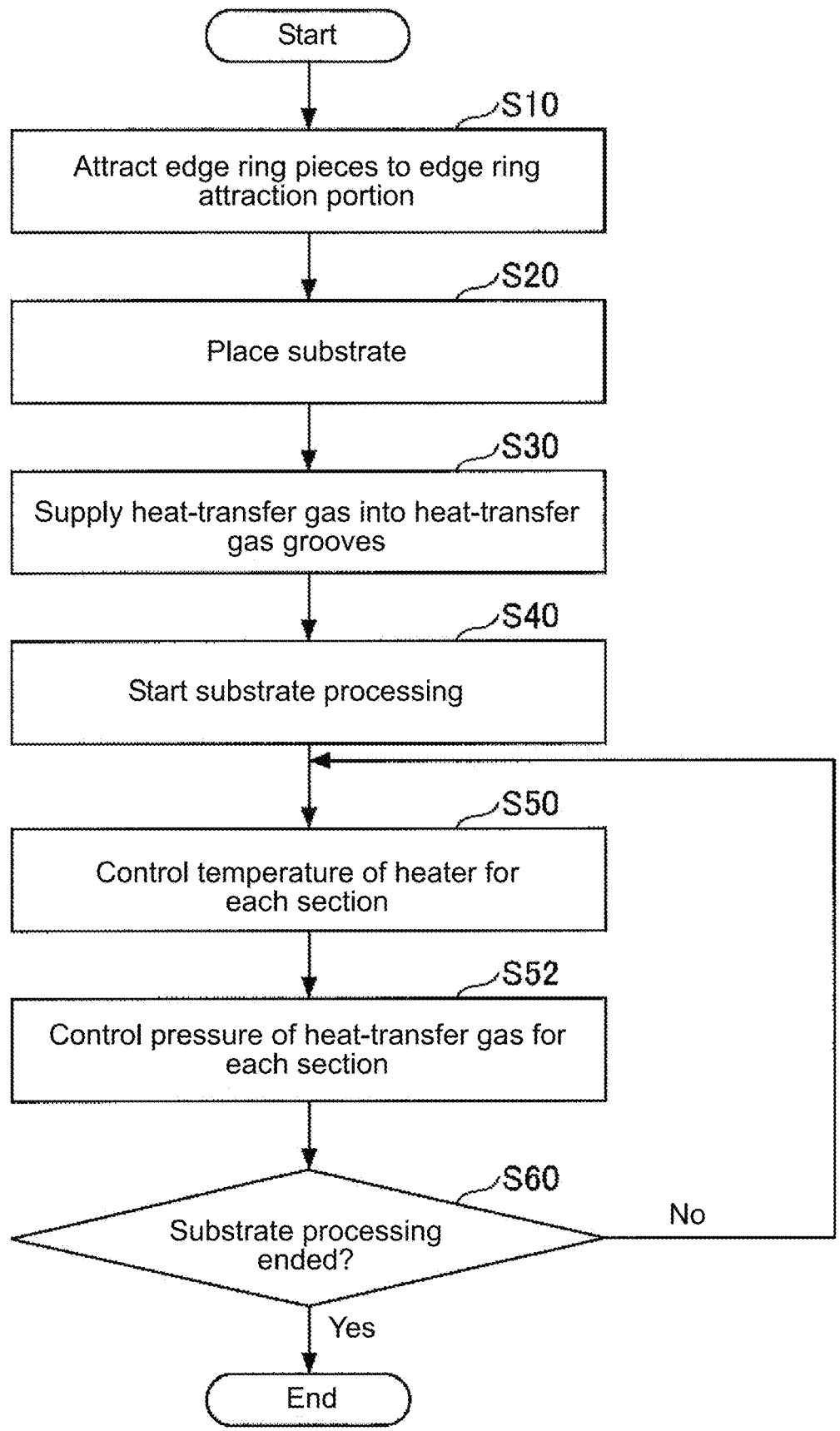
FIG. 13 is a flowchart describing a method for processing a substrate using the substrate processing apparatus according to a modification of the embodiment.

A method for processing a substrate according to a modification will now be described. FIG. 13 is a flowchart describing a method for processing a substrate using the substrate processing apparatus according to a modification of the present embodiment. With the substrate processing method shown in FIG. 13, the pressure of the heat-transfer gas to the ESC 200 is controlled at the same time as the temperature control for the edge ring using the heater 240.

To increase the etching rate in an area on the substrate W (wafer) near an edge ring piece, the pressure of the heat-transfer gas to the edge ring piece is increased. The increased pressure of the heat-transfer gas to the edge ring piece near the area in which the etching rate is to be increased facilitates the transfer of heat from the edge ring piece to the ESC 200, thus facilitating the cooling of the edge ring piece. The cooling of the edge ring piece is facilitated to decrease the temperature of the edge ring piece.

The decreased temperature of the edge ring piece can increase the etching rate in the area on the substrate W (wafer) near the edge ring piece. The phenomenon described above is an example. Decreasing the temperature of an edge ring piece may decrease the etching rate depending on the compositions (material) of the film included in the substrate W. In this case, the etching rate can be increased by increasing the temperature of the edge ring piece.

To decrease the etching rate in an area on the substrate W (wafer) near an edge ring piece, the pressure of the heat-transfer gas to the edge ring piece is decreased. The decreased pressure of the heat-transfer gas to the edge ring piece near the area in which the etching rate is to be decreased restricts the transfer of heat from the edge ring piece to the ESC 200, thus restricting the cooling of the edge ring piece. The cooling of the edge ring piece is restricted to increase the temperature of the edge ring piece.

The increased temperature of the edge ring piece can decrease the etching rate in the area on the substrate W (wafer) near the edge ring piece. The phenomenon described above is an example. Increasing the temperature of the edge ring piece may increase the etching rate depending on the compositions (material) of the film included in the substrate W. In this case, the etching rate can be decreased by decreasing the temperature of the edge ring piece.

In the first modification, controlling the pressure of the heat-transfer gas for each section (step S52) is added after step S50 to control the temperature of each edge ring piece.

Second Modification of Method for Processing Substrate

Figure 14:
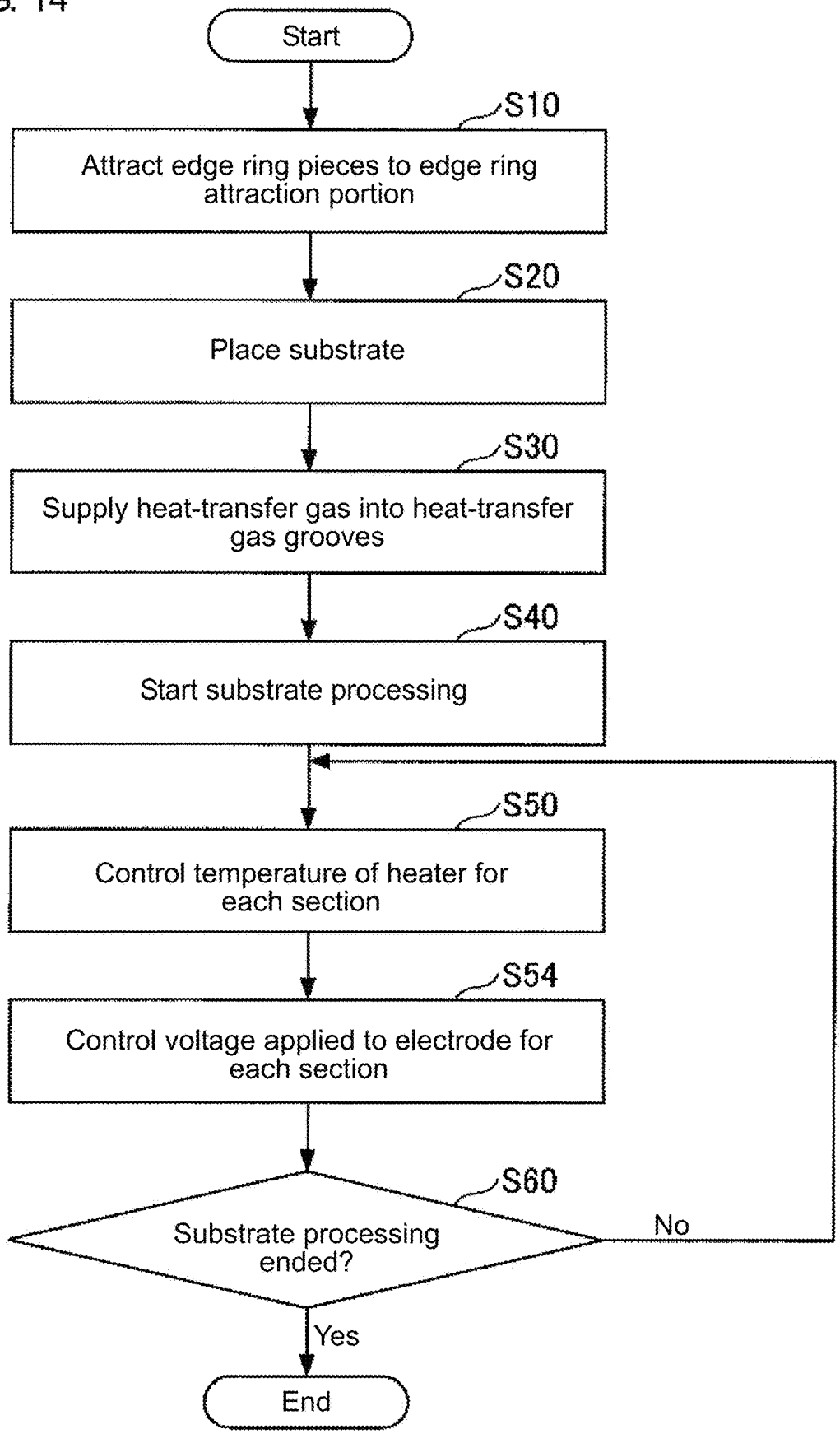
FIG. 14 is a flowchart describing a method for processing a substrate using the substrate processing apparatus according to a modification of the embodiment.

A method for processing a substrate according to a modification will now be described. FIG. 14 is a flowchart describing a method for processing a substrate using the substrate processing apparatus according to a modification of the present embodiment. With the substrate processing method shown in FIG. 14, the attraction of the ESC 200 is controlled at the same time as the temperature control for the edge ring using the heater 240.

To increase the etching rate in an area on the substrate W (wafer) near an edge ring piece, the attraction for the edge ring piece is increased. More specifically, the voltage to the electrode to attract the edge ring is increased. The increased attraction for the edge ring piece near the area in which the etching rate is to be increased facilitates the transfer of heat from the edge ring piece to the ESC 200, thus facilitating the cooling of the edge ring piece. The cooling of the edge ring piece is facilitated to decrease the temperature of the edge ring piece.

The decreased temperature of the edge ring piece can increase the etching rate of the substrate W (wafer) near the edge ring piece. The phenomenon described above is an example. Decreasing the temperature of the edge ring may decrease the etching rate depending on the compositions (material) of the film included in the substrate W. In this case, the etching rate can be increased by increasing the temperature of the edge ring piece.

To decrease the etching rate in an area on the substrate W (wafer) near an edge ring piece, the attraction for the edge ring piece is decreased. More specifically, the voltage to the electrode to attract the edge ring is decreased. The decreased attraction for the edge ring piece near the area in which the etching rate is to be decreased restricts the transfer of heat from the edge ring piece to the ESC 200, thus restricting the cooling of the edge ring piece. The cooling of the edge ring piece is restricted to increase the temperature of the edge ring piece.

The increased temperature of the edge ring piece can decrease the etching rate in the area RB on the substrate W (wafer) near the edge ring piece. The phenomenon described above is an example. Increasing the temperature of an edge ring piece may increase the etching rate depending on the compositions (material) of the film included in the substrate W. In this case, the etching rate can be decreased by decreasing the temperature of the edge ring piece.

In the second modification, controlling the voltage applied to the electrode for each section (step S54) is added after step S50 to control the temperature of each edge ring piece.

Controlling the pressure of the heat-transfer gas for each section (step S52) and controlling the voltage applied to the electrode for each section (step S54) may be performed while the temperature of the heater is being controlled for each section (step S50).

Modification of Edge Ring

Figure 15:
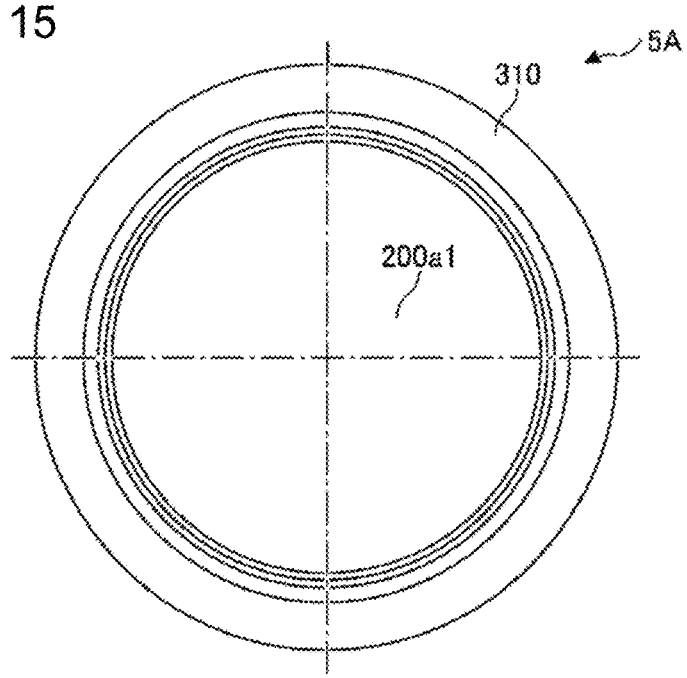
FIG. 15 is a top view of a substrate support assembly in the substrate processing apparatus according to a modification of the embodiment.

Although the substrate processing apparatus 1 according to the embodiment includes the edge ring 300 including multiple edge ring pieces, the edge ring 300 may be, for example, an integral edge ring. FIG. 15 is a top view of a substrate support assembly 5A according to a modification of the substrate support assembly 5 in the substrate processing apparatus 1 according to the present embodiment. The substrate support assembly 5A includes an integral edge ring 310.

For the edge ring 310 as well, the heater 240 is controlled to cause the distribution of temperatures across the areas in the circumferential direction of the edge ring. The edge ring 310 having the temperature distribution in the circumferential direction allows control of the etching rate of the substrate W near the edge ring 310.

Modification of Heater

Figure 16:
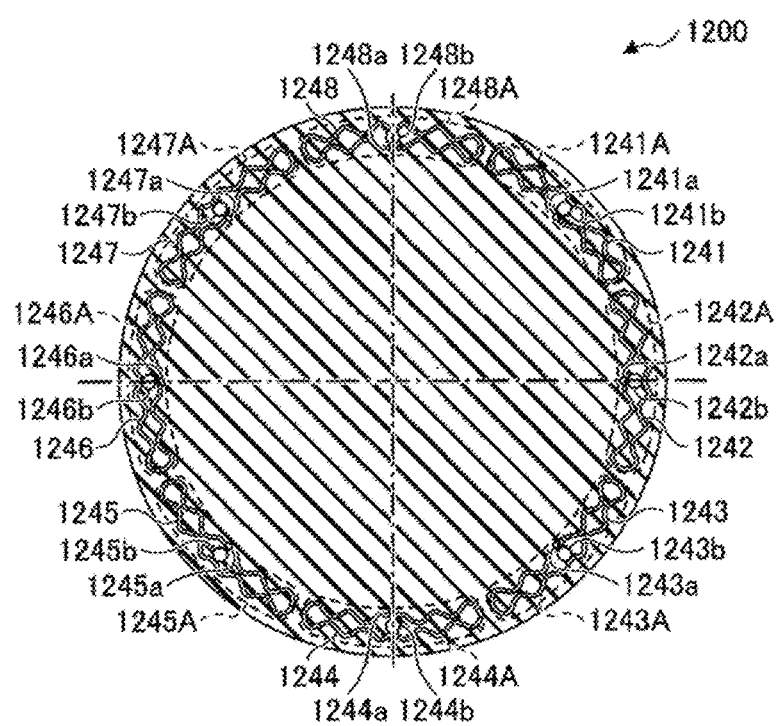
FIG. 16 is a cross-sectional view of an ESC in the substrate processing apparatus according to a modification of the embodiment.

Although the substrate processing apparatus 1 according to the present embodiment includes the heater 240 including the six heating wires, the heating wires are not limited to six heating wires. For example, the heater 240 may include three to nine heating wires. More heating wires allow finer temperature control in the circumferential direction. FIG. 16 is a cross-sectional view of an ESC 1200 according to a modification of the ESC 200 in the substrate processing apparatus 1 according to the present embodiment. More specifically, FIG. 16 is a cross-sectional view of the ESC 1200 taken along a plane parallel to the edge ring support surface (a cross-sectional view taken along a plane II-II in FIG. 2), similarly to FIG. 6. The ESC 1200 includes eight heating wires.

The ESC 1200 includes heating wires 1241 to 1248. The heating wires 1241 to 1248 include respective feeders 1241a to 1248a that receive power from the heater power supply unit 48. FIG. 16 shows through-holes 1241b to 1248b through which the gas supply lines 46 extend. The heating wires 1241 to 1248 include the respective feeders 1241a to 1248a, which are separate from one another. This allows provision (application) of power for the heater separately to each of the heating wires 1241 to 1248.

Structure of Ends of Edge Ring Pieces 301 to 306

The structure of split portions of the edge ring 300, or in other words, the structure of ends of the edge ring pieces 301 to 306, will now be described with reference to FIGS. 17 to 19. The ends of the edge ring pieces 301 to 306 may have the structure that allows the edge ring support surface 200b1 to be unexposed to plasma through portions between adjacent edge ring pieces. The portions between adjacent edge ring pieces are, for example in FIG. 3, a joint between an end 301b of the edge ring piece 301 and an end 302a of the edge ring piece 302 and a joint between an end 301a of the edge ring piece 301 and an end 306b of the edge ring piece 306.

More specifically, each of the edge ring pieces 301 to 306 has its two circumferential ends having complementary structures to vertically overlap ends of its adjacent edge ring pieces 301 to 306. The structures of the ends of the edge ring piece 301 and the ends of the edge ring piece 302 and the edge ring piece 306 adjacent to the edge ring piece 301 will now be described. Although specific edge ring pieces are described below, the same applies to the other edge ring pieces.

First Example

Figure 17:
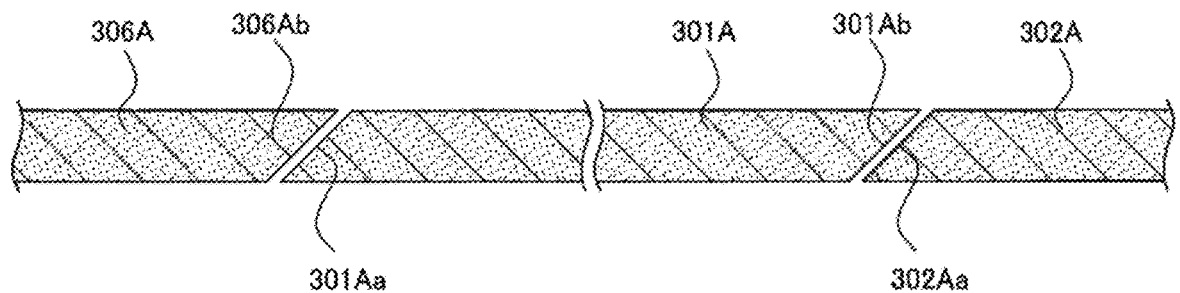
FIG. 17 is a cross-sectional view of ends of edge ring pieces in the substrate processing apparatus according to the embodiment.

FIG. 17 is a cross-sectional view of ends of an edge ring piece 301A and edge ring pieces 302A and 306A adjacent to the edge ring piece 301A in the substrate processing apparatus 1 according to the present embodiment.

In FIG. 17, the edge ring pieces 301A, 302A, and 306A each have a left side end as a first end, and a right side end as a second end. The edge ring piece 301A has a first slope 301Aa on its first end. The edge ring piece 302A has a first slope 302Aa on its first end. The edge ring piece 301A has a second slope 301Ab on its second end. The edge ring piece 306A has a second slope 306Ab on its second end.

With the edge ring 300 attracted to the edge ring attraction portion 200b, the edge ring piece 301A has the first slope 301Aa in contact with the second slope 306Ab of the adjacent edge ring piece 306A. Similarly, the edge ring piece 301A has the second slope 301Ab in contact with the first slope 302Aa of the adjacent edge ring piece 302A.

In other words, the first slope 301Aa of the edge ring piece 301A is a complementary slope vertically overlapping the second slope 306Ab of the adjacent edge ring piece 306A. The second slope 301Ab of the edge ring piece 301A is a complementary slope vertically overlapping the first slope 302Aa of the adjacent edge ring piece 302A.

Thus, in the first example, the edge ring support surface 200b1 is less likely to be exposed to plasma through joints between the edge ring piece 301A and the edge ring pieces 302A and 306A adjacent to the edge ring piece 301A.

Second Example

Figure 18:
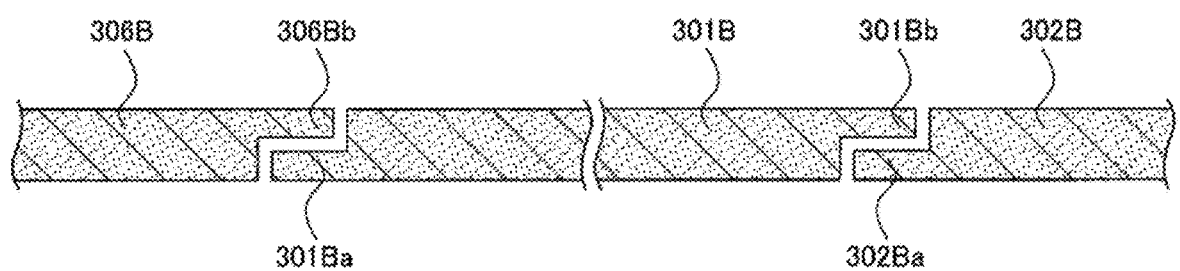
FIG. 18 is a cross-sectional view of ends of edge ring pieces in the substrate processing apparatus according to the embodiment.

FIG. 18 is a cross-sectional view of ends of an edge ring piece 301B and edge ring pieces 302B and 306B adjacent to the edge ring piece 301B in the substrate processing apparatus 1 according to the present embodiment.

In FIG. 18, the edge ring pieces 301B, 302B, and 306B each have a left side end as a first end, and a right side end as a second end. The edge ring piece 301B has a first step 301Ba on its first end. The edge ring piece 302B has a first step 302Ba on its first end. The edge ring piece 301B has a second step 301Bb on its second end. The edge ring piece 306B has a second step 306Bb on its second end.

With the edge ring 300 attracted to the edge ring attraction portion 200b, the edge ring piece 301B has the first step 301Ba fitted with the second step 306Bb of the adjacent edge ring piece 306B. Similarly, the edge ring piece 301B has the second step 301Bb fitted with the first step 302Ba of the adjacent edge ring piece 302B. In other words, the first step 301Ba of the edge ring piece 301B is a complementary step vertically overlapping the second step 306Bb of the adjacent edge ring piece 306B. The second step 301Bb of the edge ring piece 301B is a complementary step vertically overlapping the first step 302Ba of the adjacent edge ring piece 302B.

Thus, in the second example, the edge ring support surface 200b1 is less likely to be exposed to plasma through joints between the edge ring piece 301B and the edge ring pieces 302B and 306B adjacent to the edge ring piece 301B.

Third Example

Figure 19:
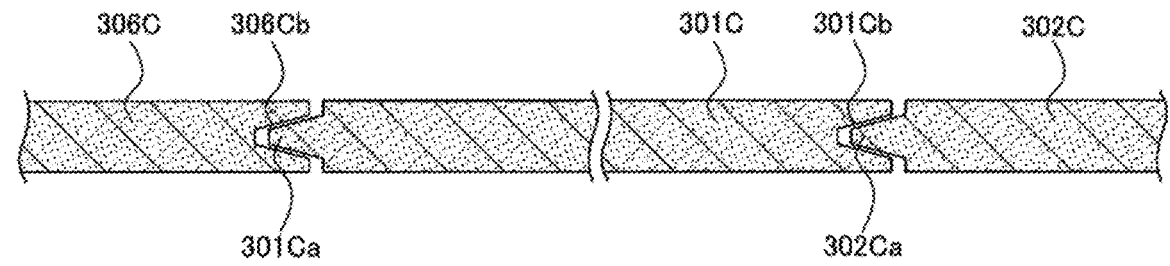
FIG. 19 is a cross-sectional view of ends of edge ring pieces in the substrate processing apparatus according to the embodiment.

FIG. 19 is a cross-sectional view of ends of an edge ring piece 301C and edge ring pieces 302C and 306C adjacent to the edge ring piece 301C in the substrate processing apparatus 1 according to the present embodiment.

In FIG. 19, the edge ring pieces 301C, 302C, and 306C each have a left side end as a first end, and a right side end as a second end. The edge ring piece 301C has a protrusion 301Ca on its first end. The edge ring piece 302C has a protrusion 302Ca on its first end. The edge ring piece 301C has a recess 301Cb on its second end. The edge ring piece 306C has a recess 306Cb on its second end.

With the edge ring 300 attracted to the edge ring attraction portion 200b, the edge ring piece 301C has the protrusion 301Ca fitted in the recess 306Cb on the adjacent edge ring piece 306C. Similarly, the edge ring piece 301C has the recess 301Cb fitted with the protrusion 302Ca on the adjacent edge ring piece 302C. In other words, the protrusion 301Ca on the edge ring piece 301C is a complementary protrusion vertically overlapping the recess 306Cb on the adjacent edge ring piece 306C. The recess 301Cb on the edge ring piece 301C is a complementary recess vertically overlapping the protrusion 302Ca on the adjacent edge ring piece 302C.

Thus, in the third example, the edge ring support surface 200b1 is less likely to be exposed to plasma through joints between the edge ring piece 301C and the edge ring pieces 302C and 306C adjacent to the edge ring piece 301C.

The substrate support assembly 5 may use any one of the above examples of ends of the edge ring pieces or a combination of any of these.

Advantages and Effects

The substrate support according to the embodiments includes the multiple heating wires. This allows independent control of the amount of the heat-transfer gas supplied to each of the heating wires, thus allowing control of the temperature of the edge ring in the circumferential direction. The temperature of the edge ring is controlled in the circumferential direction to control the etching rate of the substrate near the edge ring.

Moreover, the substrate support assembly 5 in the embodiments includes the heat-transfer gas grooves 231 to 236 each in the respective areas onto which the edge ring pieces 301 to 306 are placed. This allows independent control of the amount of the heat-transfer gas supplied to each of the heat-transfer gas grooves 231 to 236, thus allowing control of the temperature of each of the edge ring pieces 301 to 306.

Moreover, the substrate support assembly 5 in the embodiments includes the edge ring attraction electrodes 221 to 226 each in the respective areas onto which the edge ring pieces 301 to 306 are placed. This allows independent control of the attraction for each of the edge ring pieces 301 to 306, thus allowing control of temperature distribution for each of the edge ring pieces 301 to 306.

The substrate processing apparatus according to the embodiments described herein is illustrative in all aspects and should not be construed to be restrictive. The components in the above embodiments may be altered or modified in various forms without departing from the spirit and scope of the appended claims. The features described in the above embodiments may have other configurations or may be combined unless any contradiction arises.

The substrate processing apparatus according to one or more aspects of the present disclosure may be any type of substrate processing apparatus, including a capacitively coupled plasma (CCP) apparatus, an inductively coupled plasma (ICP) apparatus, an apparatus that generates plasma using microwaves such as, for example, a radial line slot antenna (RLSA) apparatus, an electron cyclotron resonance plasma (ECR) apparatus, and a helicon wave plasma (HWP) apparatus.

REFERENCE SIGNS LIST

1 Substrate processing apparatus
2 Process chamber
10 Substrate support
43 Controller
200 Electrostatic chuck (ESC)
200a Substrate attraction portion
200b Edge ring attraction portion
241 to 246 Heating wire
241a to 246a Feeder
241A to 246A Split section
231 to 236 Heat-transfer gas groove
300 Edge ring
301 to 306, 301A to 301C, 302A to 302C, 306A to 306C Edge ring piece
W Substrate

What is claimed is:

1. A substrate support, comprising:
a substrate support portion configured to support a substrate; and
an edge ring support configured to support an edge ring surrounding the substrate supported on the substrate support portion,
wherein the edge ring support includes a plurality of heating elements arranged in a circumferential direction of the edge ring support and a plurality of heater power feeders, and each of the plurality of heater power feeders is included in a corresponding heating element of the plurality of heating elements to provide power from an external source to the corresponding heating element.

2. The substrate support according to claim 1, further comprising:
a temperature sensor configured to measure a temperature of the edge ring support at a position corresponding to each of the plurality of heating elements.

3. The substrate support according to claim 1, wherein
the edge ring support includes a plurality of attraction electrodes configured to attract the edge ring, and each of the plurality of attraction electrodes is at a position corresponding to a heating element of the plurality of heating elements.

4. The substrate support according to claim 1, wherein
the edge ring support includes a plurality of heat-transfer gas grooves to supply a heat-transfer gas and a plurality of heat-transfer gas supply holes to supply the heat-transfer gas to the plurality of heat-transfer gas grooves, and each of the plurality of heat-transfer gas grooves is at a position corresponding to a heating element of the plurality of heating elements.

5. The substrate support according to claim 1, wherein
the plurality of heating elements included in the edge ring support are three to nine heating elements.

6. A substrate processing apparatus, comprising:
a chamber;
the substrate support according to claim 1 located in the chamber;
the edge ring supported on the edge ring support; and
a controller.

7. The substrate processing apparatus according to claim 6, wherein
   the edge ring includes a plurality of edge ring pieces circumferentially split from one another, and
   each of the plurality of edge ring pieces is at a position corresponding to a heating element of the plurality of heating elements.

* * * * *